(12) United States Patent
Shalvi et al.

(10) Patent No.: US 8,208,304 B2
(45) Date of Patent: Jun. 26, 2012

(54) STORAGE AT M BITS/CELL DENSITY IN N BITS/CELL ANALOG MEMORY CELL DEVICES, M>N

(75) Inventors: Ofir Shalvi, Ra'anana (IL); Naftali Sommer, Rishon Le-Zion (IL); Uri Perlmutter, Ra'anana (IL); Dotan Sokolov, Ra'anana (IL)

(73) Assignee: Anobit Technologies Ltd., Herzliya Pituach (IL)

( * ) Notice: Subject to any disclaimer, the term of this patent is extended or adjusted under 35 U.S.C. 154(b) by 267 days.

(21) Appl. No.: 12/618,732

(22) Filed: Nov. 15, 2009

(65) Prior Publication Data

US 2010/0124088 A1 May 20, 2010

Related U.S. Application Data

(60) Provisional application No. 61/115,086, filed on Nov. 16, 2008, provisional application No. 61/144,566, filed on Jan. 14, 2009, provisional application No. 61/144,629, filed on Jan. 14, 2009.

(51) Int. Cl.
*G11C 16/04* (2006.01)
(52) U.S. Cl. .......... 365/185.12; 365/185.03; 365/185.02
(58) Field of Classification Search ............. 365/185.12, 365/185.03, 185.2, 185.22–185.24, 185.33; 711/137–140
See application file for complete search history.

(56) References Cited

U.S. PATENT DOCUMENTS

| | | | |
|---|---|---|---|
| 3,668,631 A | 6/1972 | Griffith et al. | |
| 3,668,632 A | 6/1972 | Oldham | |
| 4,058,851 A | 11/1977 | Scheuneman | |
| 4,112,502 A | 9/1978 | Scheuneman | |
| 4,394,763 A | 7/1983 | Nagano et al. | |
| 4,413,339 A | 11/1983 | Riggle et al. | |
| 4,556,961 A | 12/1985 | Iwahashi et al. | |
| 4,558,431 A | 12/1985 | Satoh | |
| 4,608,687 A | 8/1986 | Dutton | |
| 4,654,847 A | 3/1987 | Dutton | |
| 4,661,929 A | 4/1987 | Aoki et al. | |
| 4,768,171 A | 8/1988 | Tada | |
| 4,811,285 A | 3/1989 | Walker et al. | |
| 4,899,342 A | 2/1990 | Potter et al. | |
| 4,910,706 A | 3/1990 | Hyatt | |
| 4,993,029 A | 2/1991 | Galbraith et al. | |

(Continued)

FOREIGN PATENT DOCUMENTS

EP 0783754 B1 7/1997

(Continued)

OTHER PUBLICATIONS

U.S. Appl. No. 12/534,898 Official Action dated Mar. 23, 2011.

(Continued)

*Primary Examiner* — David Lam
(74) *Attorney, Agent, or Firm* — D. Kligler IP Services Ltd

(57) ABSTRACT

A method for data storage includes accepting data for storage in a memory that includes multiple analog memory cells and supports a set of built-in programming commands. Each of the programming commands programs a respective page, selected from a group of N pages, in a subset of the memory cells. The subset of the memory cells is programmed to store M pages of the data, M>N, by performing a sequence of the programming commands drawn only from the set.

24 Claims, 6 Drawing Sheets

U.S. PATENT DOCUMENTS

| | | |
|---|---|---|
| 5,056,089 A | 10/1991 | Furuta et al. |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotta et al. |
| 5,182,558 A | 1/1993 | Mayo |
| 5,182,752 A | 1/1993 | DeRoo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,533,190 A | 7/1996 | Binford et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koening |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,314,044 B1 | 11/2001 | Sasaki et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yong et al. |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,480,948 B1 | 11/2002 | Virajpet et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 | 4/2003 | Pekny et al. |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzales et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 | 1/2004 | Ishii et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,732,250 B2 | 5/2004 | Durrant |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,804,805 B2 | 10/2004 | Rub |
| 6,807,095 B2 | 10/2004 | Chen et al. |
| 6,807,101 B2 | 10/2004 | Ooishi et al. |
| 6,809,964 B2 | 10/2004 | Moschopoulos et al. |
| 6,819,592 B2 | 11/2004 | Noguchi et al. |
| 6,829,167 B2 | 12/2004 | Tu et al. |

| | | |
|---|---|---|
| 6,845,052 B1 | 1/2005 | Ho et al. |
| 6,851,018 B2 | 2/2005 | Wyatt et al. |
| 6,851,081 B2 | 2/2005 | Yamamoto |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,870,773 B2 | 3/2005 | Noguchi et al. |
| 6,873,552 B2 | 3/2005 | Ishii et al. |
| 6,879,520 B2 | 4/2005 | Hosono et al. |
| 6,882,567 B1 | 4/2005 | Wong |
| 6,894,926 B2 | 5/2005 | Guterman et al. |
| 6,907,497 B2 | 6/2005 | Hosono et al. |
| 6,925,009 B2 | 8/2005 | Noguchi et al. |
| 6,930,925 B2 | 8/2005 | Guo et al. |
| 6,934,188 B2 | 8/2005 | Roohparvar |
| 6,937,511 B2 | 8/2005 | Hsu et al. |
| 6,958,938 B2 | 10/2005 | Noguchi et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 6,999,344 B2 | 2/2006 | Hosono et al. |
| 7,002,843 B2 | 2/2006 | Guterman et al. |
| 7,006,379 B2 | 2/2006 | Noguchi et al. |
| 7,012,835 B2 | 3/2006 | Gonzalez et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,039,846 B2 | 5/2006 | Hewitt et al. |
| 7,042,766 B1 | 5/2006 | Wang et al. |
| 7,054,193 B1 | 5/2006 | Wong |
| 7,054,199 B2 | 5/2006 | Lee et al. |
| 7,057,958 B2 | 6/2006 | So et al. |
| 7,065,147 B2 | 6/2006 | Ophir et al. |
| 7,068,539 B2 | 6/2006 | Guterman et al. |
| 7,071,849 B2 | 7/2006 | Zhang |
| 7,072,222 B2 | 7/2006 | Ishii et al. |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,145,805 B2 | 12/2006 | Ishii et al. |
| 7,151,692 B2 | 12/2006 | Wu |
| 7,158,058 B1 | 1/2007 | Yu |
| 7,170,781 B2 | 1/2007 | So et al. |
| 7,170,802 B2 | 1/2007 | Cernea et al. |
| 7,173,859 B2 | 2/2007 | Hemink |
| 7,177,184 B2 | 2/2007 | Chen |
| 7,177,195 B2 | 2/2007 | Gonzales et al. |
| 7,177,199 B2 | 2/2007 | Chen et al. |
| 7,177,200 B2 | 2/2007 | Ronen et al. |
| 7,184,338 B2 | 2/2007 | Nakagawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,644 B1 | 3/2007 | Anderson et al. |
| 7,196,928 B2 | 3/2007 | Chen |
| 7,196,933 B2 | 3/2007 | Shibata |
| 7,197,594 B2 | 3/2007 | Raz et al. |
| 7,200,062 B2 | 4/2007 | Kinsely et al. |
| 7,210,077 B2 | 4/2007 | Brandenberger et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,254,763 B2 | 8/2007 | Aadsen et al. |
| 7,257,027 B2 | 8/2007 | Park |
| 7,259,987 B2 | 8/2007 | Chen et al. |
| 7,266,026 B2 | 9/2007 | Gongwer et al. |
| 7,266,069 B2 | 9/2007 | Chu |
| 7,269,066 B2 | 9/2007 | Nguyen et al. |
| 7,272,757 B2 | 9/2007 | Stocken |
| 7,274,611 B2 | 9/2007 | Roohparvar |
| 7,277,355 B2 | 10/2007 | Tanzana |
| 7,280,398 B1 | 10/2007 | Lee et al. |
| 7,280,409 B2 | 10/2007 | Misumi et al. |
| 7,280,415 B2 | 10/2007 | Hwang et al. |
| 7,283,399 B2 | 10/2007 | Ishii et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,269 B2 | 12/2007 | Shibata |
| 7,310,271 B2 | 12/2007 | Lee |
| 7,310,272 B1 | 12/2007 | Mokhesi et al. |
| 7,310,347 B2 | 12/2007 | Lasser |
| 7,312,727 B1 | 12/2007 | Feng et al. |
| 7,321,509 B2 | 1/2008 | Chen et al. |
| 7,328,384 B1 | 2/2008 | Kulkarni et al. |
| 7,342,831 B2 | 3/2008 | Mokhlesi et al. |
| 7,343,330 B1 | 3/2008 | Boesjes et al. |
| 7,345,924 B2 | 3/2008 | Nguyen et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,365,671 B1 | 4/2008 | Anderson |
| 7,388,781 B2 | 6/2008 | Litsyn et al. |
| 7,397,697 B2 | 7/2008 | So et al. |
| 7,405,974 B2 * | 7/2008 | Yaoi et al. ................ 365/185.12 |
| 7,405,979 B2 | 7/2008 | Ishii et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,409,623 B2 | 8/2008 | Baker et al. |
| 7,420,847 B2 | 9/2008 | Li |
| 7,433,231 B2 | 10/2008 | Aritome |
| 7,433,697 B2 | 10/2008 | Karaoguz et al. |
| 7,434,111 B2 | 10/2008 | Sugiura et al. |
| 7,437,498 B2 | 10/2008 | Ronen |
| 7,440,324 B2 | 10/2008 | Mokhlesi |
| 7,440,331 B2 | 10/2008 | Hemink |
| 7,441,067 B2 | 10/2008 | Gorobetz et al. |
| 7,447,970 B2 | 11/2008 | Wu et al. |
| 7,450,421 B2 | 11/2008 | Mokhlesi et al. |
| 7,453,737 B2 | 11/2008 | Ha |
| 7,457,163 B2 | 11/2008 | Hemink |
| 7,457,897 B1 | 11/2008 | Lee et al. |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 | 12/2008 | Kang et al. |
| 7,468,911 B2 | 12/2008 | Lutze et al. |
| 7,469,049 B1 | 12/2008 | Feng |
| 7,471,581 B2 | 12/2008 | Tran et al. |
| 7,483,319 B2 | 1/2009 | Brown |
| 7,487,329 B2 | 2/2009 | Hepkin et al. |
| 7,487,394 B2 | 2/2009 | Forhan et al. |
| 7,492,641 B2 | 2/2009 | Hosono et al. |
| 7,508,710 B2 | 3/2009 | Mokhlesi |
| 7,526,711 B2 | 4/2009 | Orio |
| 7,539,061 B2 | 5/2009 | Lee |
| 7,539,062 B2 | 5/2009 | Doyle |
| 7,551,492 B2 | 6/2009 | Kim |
| 7,558,109 B2 | 7/2009 | Brandman et al. |
| 7,558,839 B1 | 7/2009 | McGovern |
| 7,568,135 B2 | 7/2009 | Cornwell et al. |
| 7,570,520 B2 | 8/2009 | Kamei et al. |
| 7,574,555 B2 | 8/2009 | Porat et al. |
| 7,590,002 B2 | 9/2009 | Mokhlesi et al. |
| 7,593,259 B2 | 9/2009 | Kim |
| 7,594,093 B1 | 9/2009 | Kancherla |
| 7,596,707 B1 | 9/2009 | Vemula |
| 7,609,787 B2 | 10/2009 | Jahan et al. |
| 7,613,043 B2 * | 11/2009 | Cornwell et al. ........ 365/185.18 |
| 7,616,498 B2 | 11/2009 | Mokhlesi et al. |
| 7,619,918 B2 | 11/2009 | Aritome |

| | | |
|---|---|---|
| 7,631,245 B2 | 12/2009 | Lasser |
| 7,633,798 B2 | 12/2009 | Sarin et al. |
| 7,633,802 B2 | 12/2009 | Mokhlesi |
| 7,639,532 B2 | 12/2009 | Roohparvar et al. |
| 7,644,347 B2 | 1/2010 | Alexander et al. |
| 7,656,734 B2 | 2/2010 | Thorp et al. |
| 7,660,158 B2 | 2/2010 | Aritome |
| 7,660,183 B2 | 2/2010 | Ware et al. |
| 7,661,000 B2 | 2/2010 | Ueda et al. |
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 | 6/2010 | Walston et al. |
| 7,742,351 B2 | 6/2010 | Inoue et al. |
| 7,761,624 B2 | 7/2010 | Karamcheti et al. |
| 7,797,609 B2 | 9/2010 | Neuman |
| 7,810,017 B2 | 10/2010 | Radke |
| 7,848,149 B2 | 12/2010 | Gonzales et al. |
| 7,869,273 B2 | 1/2011 | Lee et al. |
| 7,885,119 B2 | 2/2011 | Li |
| 7,904,783 B2 | 3/2011 | Brandman et al. |
| 7,928,497 B2 | 4/2011 | Yaegashi |
| 7,929,549 B1 | 4/2011 | Talbot |
| 7,930,515 B2 | 4/2011 | Gupta et al. |
| 7,945,825 B2 | 5/2011 | Cohen et al. |
| 7,978,516 B2 | 7/2011 | Olbrich et al. |
| 8,014,094 B1 | 9/2011 | Jin |
| 8,037,380 B2 | 10/2011 | Cagno et al. |
| 8,040,744 B2 | 10/2011 | Gorobets et al. |
| 8,065,583 B2 | 11/2011 | Radke |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Van Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0144361 A1 | 6/2005 | Gonzalez et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0104211 A1 | 5/2007 | Opsasnick |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0123426 A1 | 5/2008 | Lutze et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |

| | | |
|---|---|---|
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0217598 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0199074 A1 | 8/2009 | Sommer et al. |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0228761 A1 | 9/2009 | Perlmutter et al. |
| 2009/0240872 A1 | 9/2009 | Perlmutter et al. |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0131697 A1 | 5/2010 | Alrod et al. |
| 2010/0142268 A1 | 6/2010 | Aritome |
| 2010/0142277 A1 | 6/2010 | Yang et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0211803 A1 | 8/2010 | Labland |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0149657 A1 | 6/2011 | Haratsch et al. |
| 2011/0199823 A1 | 8/2011 | Bar-Or et al. |
| 2011/0302354 A1 | 12/2011 | Miller |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |
| WO | 2011024015 A1 | 3/2011 |

OTHER PUBLICATIONS

U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
U.S. Appl. No. 12/344,233 Official Action dated Jun. 24, 2011.
U.S. Appl. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
CN Patent Application # 200780026181.3 Official Action dated Apr. 8, 2011.
Huffman, A., "Non-Volatile Memory Host Controller Interface (NVMHCI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. 12/822,207 "Adaptive Over-Provisioning in Memory Systems" filed on Jun. 24, 2010.
U.S. Appl. No. 12/880,101 "Reuse of Host Hibernation Storage Space by Memory Controller", filed on Sep. 12, 2010.
U.S. Appl. No. 12/890,724 "Error Correction Coding Over Multiple Memory Pages", filed on Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.
Numonyx, "M25PE16: 16-Mbit, page-erasable serial flash memory with byte-alterability, 75 MHz SPI bus, standard pinout", Apr. 2008.
U.S. Appl. No. 11/995,814 Official Action dated Dec. 17, 2010.
U.S. Appl. No. 12/388,528 Official Action dated Nov. 29, 2010.
U.S. Appl. No. 12/251,471 Official Action dated Jan. 3, 2011.

Engineering Windows 7, "Support and Q&A for Solid-State Drives", e7blog, May 5, 2009.

Micron Technology Inc., "Memory Management in NAND Flash Arrays", Technical Note, year 2005.

Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.

Park et al., "Sub-Grouped Superblock Management for High-Performance Flash Storages", IEICE Electronics Express, vol. 6, No. 6, pp. 297-303, Mar. 25, 2009.

"How to Resolve "Bad Super Block: Magic Number Wrong" in BSD", Free Online Articles Director Article Base, posted Sep. 5, 2009.

Ubuntu Forums, "Memory Stick Failed IO Superblock", posted Nov. 11, 2009.

Super User Forums, "SD Card Failure, can't read superblock", posted Aug. 8, 2010.

U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
US 7,161,836, 01/2007, Wan et al. (withdrawn).

JEDEC Standard JESD84-C44, "Embedded MultiMediaCard (e•MMC) Mechanical Standard, with Optional Reset Signal", Jedec Solid State Technology Association, USA, Jul. 2009.

JEDEC, "UFS Specification", version 0.1, Nov. 11, 2009.

SD Group and SD Card Association, "SD Specifications Part 1 Physical Layer Specification", version 3.01, draft 1.00, Nov. 9, 2009.

Compaq et al., "Universal Serial Bus Specification", revision 2.0, Apr. 27, 2000.

Serial ATA International Organization, "Serial ATA Revision 3.0 Specification", Jun. 2, 2009.

Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.

Wei, L., "Trellis-Coded Modulation With Multidimensional Constellations", IEEE Transactions on Information Theory, vol. IT-33, No. 4, pp. 483-501, Jul. 1987.

U.S. Appl. No. 13/114,049 Official Action dated Sep. 12, 2011.
U.S. Appl. No. 12/405,275 Official Action dated Jul. 29, 2011.

Conway et al., "Sphere Packings, Lattices and Groups", 3rd edition, chapter 4, pp. 94-135, Springer, New York, USA 1998.

Chinese Patent Application # 200780040493.X Official Action dated Jun. 15, 2011.

U.S. Appl. No. 12/037,487 Official Action dated Oct. 3, 2011.
U.S. Appl. No. 12/649,360 Official Action dated Aug. 9, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 13/192,495, filed Jul. 28, 2011.

Agrell et al., "Closest Point Search in Lattices", IEEE Transactions on Information Theory, vol. 48, No. 8, pp. 2201-2214, Aug. 2002.

Bez et al., "Introduction to Flash memory", Proceedings of the IEEE, vol. 91, No. 4, pp. 489-502, Apr. 2003.

Blahut, R.E., "Theory and Practice of Error Control Codes," Addison-Wesley, May 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in FLASH", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

ONFI, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

St Microelectronics, "Bad Block Management in NAND Flash Memories", Application note AN-1819, Geneva, Switzerland, May 2004.

St Microelectronics, "Wear Leveling in Single Level Cell NAND Flash Memories," Application note AN-1822 Geneva, Switzerland, Feb. 2007.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Takeuchi et al., "A Multipage Cell Architecture for High-Speed Programming Multilevel NAND Flash Memories", IEEE Journal of Solid State Circuits, vol. 33, No. 8, Aug. 1998.

Wu et al., "eNVy: A non-Volatile, Main Memory Storage System", Proceedings of the 6th International Conference on Architectural support for programming languages and operating systems, pp. 86-87, San Jose, USA, 1994.
International Application PCT/IL2007/000575 Patentability report dated Mar. 26, 2009.
International Application PCT/IL2007/000575 Search Report dated May 30, 2008.
International Application PCT/IL2007/000576 Patentability Report dated Mar. 19, 2009.
International Application PCT/IL2007/000576 Search Report dated Jul. 7, 2008.
International Application PCT/IL2007/000579 Patentability report dated Mar. 10, 2009.
International Application PCT/IL2007/000579 Search report dated Jul. 3, 2008.
International Application PCT/IL2007/000580 Patentability Report dated Mar. 10, 2009.
International Application PCT/IL2007/000580 Search Report dated Sep. 11, 2008.
International Application PCT/IL2007/000581 Patentability Report dated Mar. 26, 2009.
International Application PCT/IL2007/000581 Search Report dated Aug. 25, 2008.
International Application PCT/IL2007/001059 Patentability report dated Apr. 19, 2009.
International Application PCT/IL2007/001059 Search report dated Aug. 7, 2008.
International Application PCT/IL2007/001315 search report dated Aug. 7, 2008.
International Application PCT/IL2007/001315 Patentability Report dated May 5, 2009.
International Application PCT/IL2007/001316 Search report dated Jul. 22, 2008.
International Application PCT/IL2007/001316 Patentability Report dated May 5, 2009.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
U.S. Appl. No. 11/949,135, Official Action dated Oct. 2, 2009.
U.S. Appl. No. 12/019,011, Official Action dated Nov. 20, 2009.
Sommer, N., U.S. Appl. No. 12/171,797, "Memory Device with Non-Uniform Programming Levels" filed on Jul. 11, 2008.
Shalvi et al., U.S. Appl. No. 12/251,471, "Compensation for Voltage Drifts in Analog Memory Cells" filed on Oct. 15, 2008.
Sommer et al., U.S. Appl. No. 12/497,707, "Data Storage in Analog Memory Cells with Protection Against Programming Interruption" filed on Jul. 6, 2009.
Winter et al., U.S. Appl. No. 12/534,893, "Improved Data Storage in Analog Memory Cells Using Modified Pass Voltages" filed on Aug. 4, 2009.
Winter et al., U.S. Appl. No. 12/534,898, "Data Storage Using Modified Voltages" filed on Aug. 4, 2009.

Shalvi et al., U.S. Appl. No. 12/551,583, "Segmented Data Storage" filed on Sep. 1, 2009.
Shalvi et al., U.S. Appl. No. 12/551,567, "Reliable Data Storage in Analog Memory Cells Subjected to Long Retention Periods" filed on Sep. 1, 2009.
Perlmutter et al., U.S. Appl. No. 12/558,528, "Estimation of Memory Cell Read Thresholds by Sampling Inside Programming Level Distribution Intervals" filed on Sep. 13, 2009.
Sokolov, D., U.S. Appl. No. 12/579,430, "Efficient Programming of Analog Memory Cell Devices" filed on Oct. 15, 2009.
Shalvi, O., U.S. Appl. No. 12/579,432, "Efficient Data Storage in Storage Device Arrays" filed on Oct. 15, 2009.
Sommer et al., U.S. Appl. No. 12/607,078, "Data Scrambling in Memory Devices" filed on Oct. 28, 2009.
Sommer et al., U.S. Appl. No. 12/607,085, "Data Scrambling Schemes for Memory Devices" filed on Oct. 28, 2009.
Shalvi et al., U.S. Appl. No. 12/618,732, "Storage at M Bits/Cell Density in N Bits/Cell Analog Memory Cell Devices, M>N" filed on Nov. 15, 2009.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
U.S. Appl. No. 11/945,575, Official Action dated Aug. 24, 2010.
U.S. Appl. No. 12/045,520, Official Action dated Nov. 16, 2010.
U.S. Appl. No. 12/323,544 Office Action dated Dec. 13, 2011.
U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
U.S. Appl. No. 12/649,382 Office Action dated Jan. 6, 2012.
U.S. Appl. No. 13/284,909, filed on Oct. 30, 2011.
U.S. Appl. No. 13/284,913, filed on Oct. 30, 2011.
U.S. Appl. No. 13/338,335, filed on Dec. 28, 2011.
U.S. Appl. No. 13/355,536, filed on Jan. 22, 2012.
U.S. Appl. No. 12/323,544 Official Action dated Mar. 9, 2012.
Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model—5 (SAM-5)", INCITS document T10/2104-D, revision 01, Jan. 28, 2008.
SAS Protocol, "Information Technology—Serial Attached SCSI—2 (SAS-2)", INCITS document T10/1760-D, revision 15a, Feb. 22, 2009.

* cited by examiner

STORAGE AT M BITS/CELL DENSITY IN N BITS/CELL ANALOG MEMORY CELL DEVICES, M>N

CROSS-REFERENCE TO RELATED APPLICATIONS

This application claims the benefit of U.S. Provisional Patent Application 61/115,086, filed Nov. 16, 2008, U.S. Provisional Patent Application 61/144,566, filed Jan. 14, 2009, and U.S. Provisional Patent Application 61/144,629, filed Jan. 14, 2009, whose disclosures are incorporated herein by reference.

FIELD OF THE INVENTION

The present invention relates generally to memory devices, and particularly to methods and systems for high-density storage in analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume either of two possible programming levels. Higher-density devices, often referred to as Multi-Level Cell (MLC) devices, store two or more bits per memory cell, i.e., can be programmed to assume more than two possible programming levels.

SUMMARY OF THE INVENTION

An embodiment of the present invention provides a method for data storage, including:

accepting data for storage in a memory that includes multiple analog memory cells and supports a set of built-in programming commands, each of which programming commands programs a respective page, selected from a group of N pages, in a subset of the memory cells; and programming the subset of the memory cells to store M pages of the data, M>N, by performing a sequence of the programming commands drawn only from the set.

In some embodiments, the memory further supports a list of built-in read commands, each of which read commands reads a respective one of the group of the N pages, and the method includes reading the M pages from the subset of the memory cells by performing a series of read commands drawn only from the list. In an embodiment, performing the series of the read commands includes notifying the memory of one or more read threshold values to be applied in at least one of the read commands in the series.

In a disclosed embodiment, programming the subset of the memory cells includes caching the data in the memory in no more than N page buffers. In another embodiment, programming the subset of the memory cells includes notifying the memory of one or more programming threshold values to be applied in at least one of the programming commands in the sequence. In yet another embodiment, programming the subset of the memory cells includes applying a series of programming pulses to the memory cells in the subset, and notifying the memory of a characteristic of the programming pulses to be applied during at least one of the programming commands in the sequence. In an embodiment, a given programming command in the sequence involves reading a previously-programmed page from the subset of the memory cells using one or more read thresholds, and programming the subset of the memory cells includes notifying the memory of respective values of the one or more read thresholds.

In a disclosed embodiment, programming the subset of the memory cells includes, during a given programming command in the sequence, modifying respective storage values of only some of the memory cells in the subset by programming the other memory cells in the subset with respective data values that cause their storage values to remain unchanged by the given programming command. In an embodiment, the method includes configuring the memory to operate in one of first and second operational modes, and programming the subset of the memory cells includes storing a maximum of M pages in the subset of the memory cells when operating in the first operational mode, and storing a maximum of N pages in the subset of the memory cells when operating in the second operational mode.

There is additionally provided, in accordance with an embodiment of the present invention, a data storage apparatus, including:

an interface for communicating with a memory that includes multiple analog memory cells and supports a set of built-in programming commands, each of which programming commands programs a respective page, selected from a group of N pages, in a subset of the memory cells; and a processor, which is configured to accept data for storage in the memory, and to program the subset of the memory cells to store M pages of the data, M>N, by performing a sequence of the programming commands drawn only from the set.

There is also provided, in accordance with an embodiment of the present invention, a data storage apparatus, including:

a memory, which includes multiple analog memory cells and supports a set of built-in programming commands, each of which programming commands programs a respective page, selected from a group of N pages, in a subset of the memory cells; and a processor, which is configured to accept data for storage in the memory, and to program the subset of the memory cells to store M pages of the data, M>N, by performing a sequence of the programming commands drawn only from the set.

There is further provided, in accordance with an embodiment of the present invention, a method for data storage, including:

accepting data for storage in a memory that includes multiple analog memory cells and supports a set of built-in programming commands for programming the memory cells to a first number of programming states; and programming the memory cells to a second number of programming states, which is less than the first number and is not an integer power of two, by performing a sequence of the programming commands drawn only from the set.

There is additionally provided, in accordance with an embodiment of the present invention, a method for data storage, including:

accepting a request to retrieve data from a memory, which includes multiple analog memory cells, holds M pages of the data in a subset of the memory cells, and supports a list of built-in read commands, each of which read commands reads a respective one of N pages, N<M; and responsively to the request, reading the M pages from the subset of the memory cells by performing a series of read commands drawn only from the list.

The present invention will be more fully understood from the following detailed description of the embodiments thereof, taken together with the drawings in which:

DETAILED DESCRIPTION OF EMBODIMENTS

Overview

Figure 1:
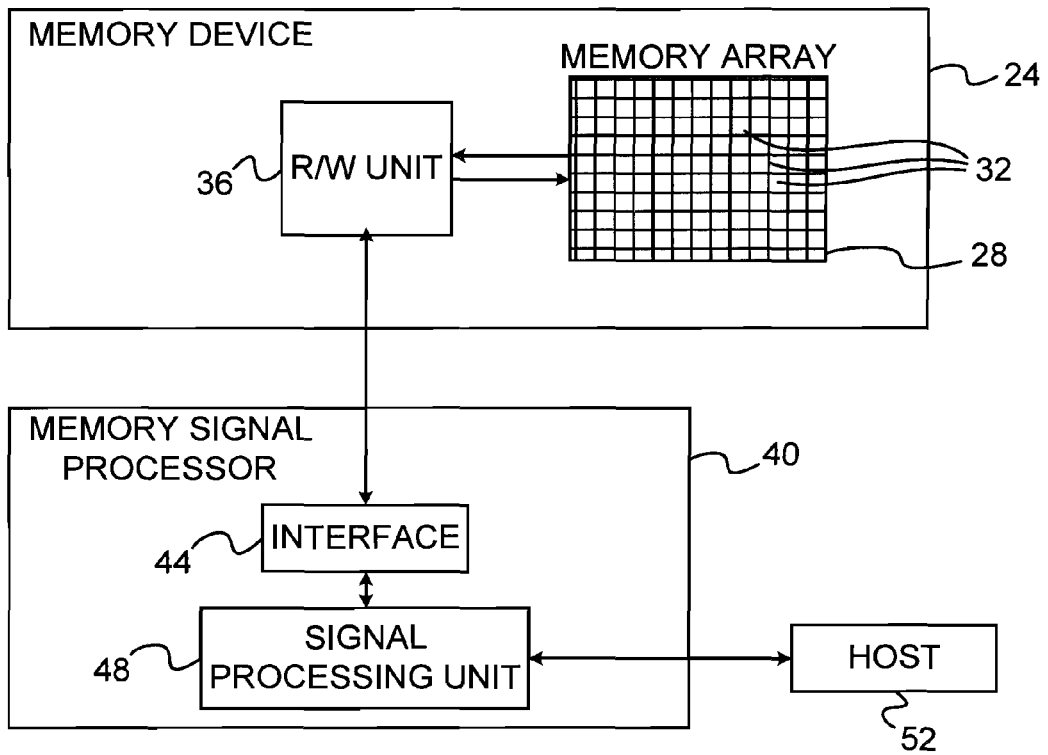
FIG. 1 is a block diagram that schematically illustrates a memory system, in accordance with an embodiment of the present invention.

A Multi-Level Cell (MLC) memory device comprises multiple analog memory cells, which store data at a density of two or more bits/cell. Typically, the data is stored by programming each memory cell to one of multiple predefined analog storage values (e.g., electrical charge levels or threshold voltages). Each analog storage value corresponds to a respective programming state (also referred to as a programming level), which represents the particular combination of bit values stored in that memory cell. For example, four-level MLC devices use four programming states to store data at a density of two bits/cell. Eight-level MLC devices store three bits/cell using eight programming states.

In the description that follows, the two bits of a four-level memory cell are referred to as $BIT_0$ and $BIT_1$, and the three bits of an eight-level memory cell are referred to as $BIT_0$, $BIT_1$ and $BIT_2$. Typically, different MLC bits in a given group of memory cells correspond to different memory pages. For example, a group of four-level memory cells can be used to store one memory page in the cells' $BIT_0$s, and another memory page in the cells' $BIT_1$s. A group of eight-level memory cells can be used to store three memory pages, one page in the $BIT_0$s, another page in the $BIT_1$s, and a third page in the $BIT_2$s of the cells. These memory pages are referred to herein as PAGE0, PAGE1 and PAGE2, respectively.

Typically, a memory device that is designed to store data at a certain density supports a set of built-in programming commands. Each command in the set stores data in a certain page of a group of memory cells. For example, a memory device designed to store two bits/cell typically supports two built-in programming commands, referred to as a PAGE_0 programming command and a PAGE_1 programming command.

Embodiments of the present invention that are described hereinbelow provide methods and systems for high-density storage in analog memory cells. These methods and systems enable a memory device, which is originally designed to store data at N bits/cell, to store data at a higher density of M bits/cell, where M>N.

In some embodiments, a memory device that includes multiple analog memory cells supports a set of built-in programming commands. Each command in the set programs a certain page out of N possible pages in a group of memory cells. A Memory Signal Processor (MSP) or other processor stores data in this memory device at a density of M bits/cell, M>N. The MSP stores M pages in a group of memory cells by performing a sequence of programming commands, which are drawn only from the set of built-in programming commands supported by the memory device. For example, the MSP may store three memory pages in a group of analog memory cells by performing a sequence of PAGE_0 and PAGE_1 programming commands. Command attributes are chosen so that the end result is a group of memory cells that are programmed to $2^M$ different programming states, even though the built-in programming commands only go as far as programming $2^N$ states. Several example programming schemes are described in detail below.

In some embodiments, the memory device in question supports a set of built-in read commands. Each read command in the set reads from a group of memory cells a certain page out of N possible pages. The MSP reads M pages (M>N) from each memory cell in a given cell group by performing a series of read commands, which are drawn only from the set of built-in read commands supported by the memory device.

By using the methods and systems described herein, legacy memory devices can be used to store data at a higher density than they were originally designed for. As a result, the cost of memory systems can be reduced and storage capacity can be increased. Additionally, the disclosed techniques can extend the effective lifetime of a given memory fabrication process, and allow a gradual migration path toward higher-density processes.

In some embodiments, a given memory device may support two operational modes. One mode (a "high-reliability mode") stores data at N bits/cell. The other mode (a "high-capacity mode") stores data at M bits/cell. The selection whether to operate the memory device in the high-reliability or in the high-capacity mode can be made, for example, during production. Such dual-mode operation enables memory manufacturers to enjoy the economy-of-scale benefits of producing large volumes of a given design, while at the same time offering multiple products having different storage capacities.

Moreover, in some memory devices, the size and complexity of internal hardware (e.g., page buffers and reading/writing circuitry) grows with the device's specified storage density. The disclosed methods and systems enable using a low-density memory device, whose internal hardware is relatively small and simple, for storing data at high density. As a result, the cost, size and complexity of memory devices can be reduced.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 32 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In particular, when memory device 24 comprises an N bits/cell device, unit 48 may store data in device 24 at a density of M>N bits/cell, using methods that are described below.

In some embodiments, unit 48 produces the storage values for storing in the memory cells and provides these values to R/W unit 36. Alternatively, unit 48 provides the data for storage, and the conversion to storage values is carried out by the R/W unit internally to the memory device. Alternatively to using an MSP, the methods described herein can be carried out by any suitable type of memory controller.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. For example, although the example of FIG. 1 shows a single memory device, in alternative embodiments MSP 40 may control multiple memory devices 24. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and the MSP may be integrated on separate semiconductor dies in a single Multi-Chip Package (MCP) or System on Chip (SoC), and may be interconnected by an internal bus. Further alternatively, some or all of the MSP circuitry may reside on the same die on which the memory array is disposed. Further alternatively, some or all of the functionality of MSP 40 can be implemented in software and carried out by a processor or other element of the host system. In some embodiments, host 44 and MSP 40 may be fabricated on the same die, or on separate dies in the same device package.

In some embodiments, MSP 40 (or other memory controller that carries out the methods described herein) comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously.

Pages are sometimes sub-divided into sectors. In some embodiments, each page occupies an entire row of the array, i.e., an entire word line. For two-bit-per-cell devices, for example, each word line stores two pages. In alternative embodiments, each row (word line) can be divided into two or more pages. For example, in some devices each row is divided into two pages, one comprising the odd-order cells and the other comprising the even-order cells. In an example implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several thousand cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used. Some memory devices comprise two or more separate memory cell arrays, often referred to as planes. Since each plane has a certain "busy" period between successive write operations, data can be written alternately to the different planes in order to increase programming speed.

A given memory device 24 is typically designed and specified to store data at a given density of N bits/cell. The bits stored in each memory cell are denoted $BIT_0 \ldots BIT_{N-1}$. Typically, different bits in a given group of memory cells correspond to different memory pages. For example, a group of four-level memory cells can be used to store one memory page in the cells' $BIT_0$s, and another memory page in the cells' $BIT_1$s. A group of eight-level memory cells can be used to store three memory pages, one page in the $BIT_0$s, another page in the $BIT_1$s, and a third page in the $BIT_2$s of the cells. These memory pages are referred to herein as PAGE0, PAGE1 and PAGE2, respectively.

Specifying a memory device to store N bits/cell may affect various aspects of the device's design. For example, the memory device typically supports a set of built-in programming commands, which program the N bits of each memory cell. Each command in the set stores data in a certain bit of a group of memory cells, and typically corresponds to storage of a memory page. For example, a memory device designed to store two bits/cell typically supports two built-in programming commands, referred to as a PAGE_0 programming command and a PAGE_1 programming command. A 3 bits/cell device typically supports three built-in programming commands—for programming PAGE_0, PAGE_1 and PAGE_2 in a given group of memory cells. Typically R/W unit 36 of the memory device stores data in array 28 by executing the built-in programming commands, in response to instructions from the MSP or other memory controller.

Figure 2:
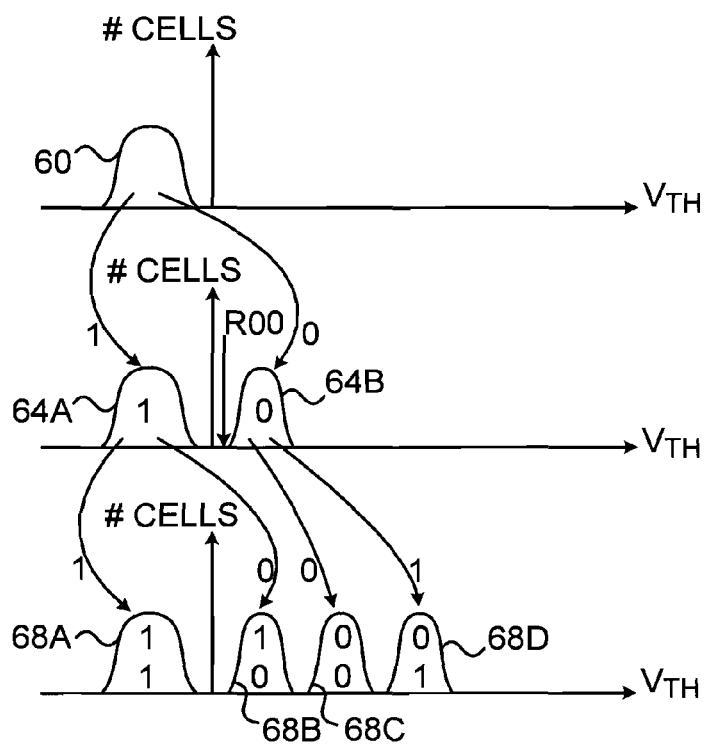
FIG. 2 is a diagram showing programming levels and a set of built-in programming commands, in accordance with an embodiment of the present invention.

FIG. 2 is a diagram showing programming levels and a set of built-in programming commands in an example memory device, in accordance with an embodiment of the present invention. In the present example, the memory device comprises a 2 bit/cell device, and the set of built-in programming commands consists of a PAGE_0 programming command and a PAGE_1 programming command. The figure shows three graphs, which show the threshold voltage distribution in a group of memory cells at various programming stages.

The top graph shows the threshold voltage distribution when the cell group in question is erased, i.e., prior to programming. At this stage, the threshold voltages of the memory cells are distributed in accordance with a distribution 60. Typically although not necessarily, erased cells are assigned negative threshold voltages.

The middle graph shows the threshold voltage distribution after applying the PAGE_0 programming command. The PAGE_0 programming command programs the memory cells in the group to store PAGE0, i.e., programs $BIT_0$s of the memory cells. Memory cells whose $BIT_0$="1" remain programmed with the negative threshold voltage, i.e., are associated with a distribution 64A. Memory cells whose $BIT_0$="0" are programmed to a programming state that is associated with a distribution 64B. Generally, distribution 64A may have a different (typically smaller) variance than distribution 60.

The bottom graph in FIG. 2 shows the threshold voltage distribution after applying the PAGE_1 programming command, which programs the memory cells in the group to store PAGE1, i.e., programs $BIT_1$s of the memory cells. Memory cells whose $BIT_0$ was "1" and whose $BIT_1$ is now programmed to "1" remain programmed with the negative threshold voltage, i.e., are associated with a distribution 68A. Memory cells whose $BIT_0$="1" and whose $BIT_1$="0" are programmed to a programming state that is associated with a distribution 68B. Memory cells whose $BIT_0$="0" and whose $BIT_1$="0" are programmed to a programming state that is associated with a distribution 68C. Memory cells whose $BIT_0$="0" and whose $BIT_1$="1" are programmed to a programming state that is associated with a distribution 68D.

Note that when programming PAGE1, the programming state of a given memory cell depends on the value of $BIT_1$ that is currently being programmed, and also on the value of $BIT_0$ that was previously programmed in that memory cell. Therefore, in some embodiments, the built-in PAGE_1 programming command involves reading the $BIT_0$ values from the memory cells in the group, and then programming the memory cells to the appropriate programming states based on both $BIT_0$ and $BIT_1$ values. In the present example, R/W unit 36 reads the $BIT_0$ values by comparing the threshold voltages of the memory cells to a read threshold denoted R00. In the example of FIG. 2, R00 is located near 0V. In some embodiments, the position of read threshold R00 can be set and modified by the MSP.

Typically, R/W unit 36 programs the memory cells to the different memory states using an iterative Program and Verify (P&V) process. In this sort of process, the R/W unit applies a sequence of programming pulses to the group of memory cells (which are typically located along a given word line). After each programming iteration the cell storage values are read and verified, by comparing them to one or more programming thresholds. Subsequent programming pulses are applied selectively, only to the memory cells that have not yet reached the intended storage values.

In some embodiments, each built-in programming command has one or more attributes. Command attributes may comprise, for example, the programming thresholds used in the programming verification process (also referred to as PV levels). These thresholds determine the location of the different programming states on the threshold voltage axis. Another possible command attribute may comprise the R00 read threshold described above. Yet another type of command attribute may comprise a characteristic of the programming pulses, such as the amplitude or duration of the programming pulses, or the size of an incremental increase in amplitude between successive programming pulses. This attribute determines the accuracy at which the cells are programmed, and therefore the variance of the programming state distributions. Additionally or alternatively, the built-in programming commands may have any other suitable type of attribute.

In some embodiments, some or all of the command attributes can be set and modified by the MSP. The MSP and memory device may support a command or signal interface for transferring command attributes. Some aspects of exchanging command attributes between a memory controller and a memory device are addressed in U.S. Patent Application Publication 2008/0263262, entitled "Command Interface for Memory Devices," whose disclosure is incorporated herein by reference.

The programming states and the built-in programming commands in FIG. 2 are shown purely by way of example. In alternative embodiments, the methods and systems described herein can be used with any other suitable configuration of programming states and any other suitable set of built-in programming commands.

M Bits/Cell Storage Using N Bits/Cell Programming Commands, M>N

In some embodiments of the present invention, MSP 40 uses a memory device, which is designed and specified to store data at N bits/cell, to store data at a higher density of M bits/cell, M>N. In particular, the memory device may support a set of built-in programming commands that program the $i^{th}$ bits in the memory cells, $i \leq N$. The MSP stores M bits in a group of memory cells of this memory device by performing a sequence of programming commands, which are drawn only from the set of built-in programming commands supported by the device.

The description that follows demonstrates processes of storing data at 3 bits/cell in a 2 bits/cell memory device that supports only PAGE_0 and PAGE_1 programming commands. These techniques, however, can be generalized in a straightforward manner to any desired values on N and M. Generally, M and N need not necessarily be integers. For example, data can be stored using six programming states. In the description below, the terms "page" and "bit" are sometimes used interchangeably. For example, a reference to "programming PAGE0 in a group of memory cells" is equivalent to "programming the $BIT_0$s of the memory cells in the group."

Figure 3:
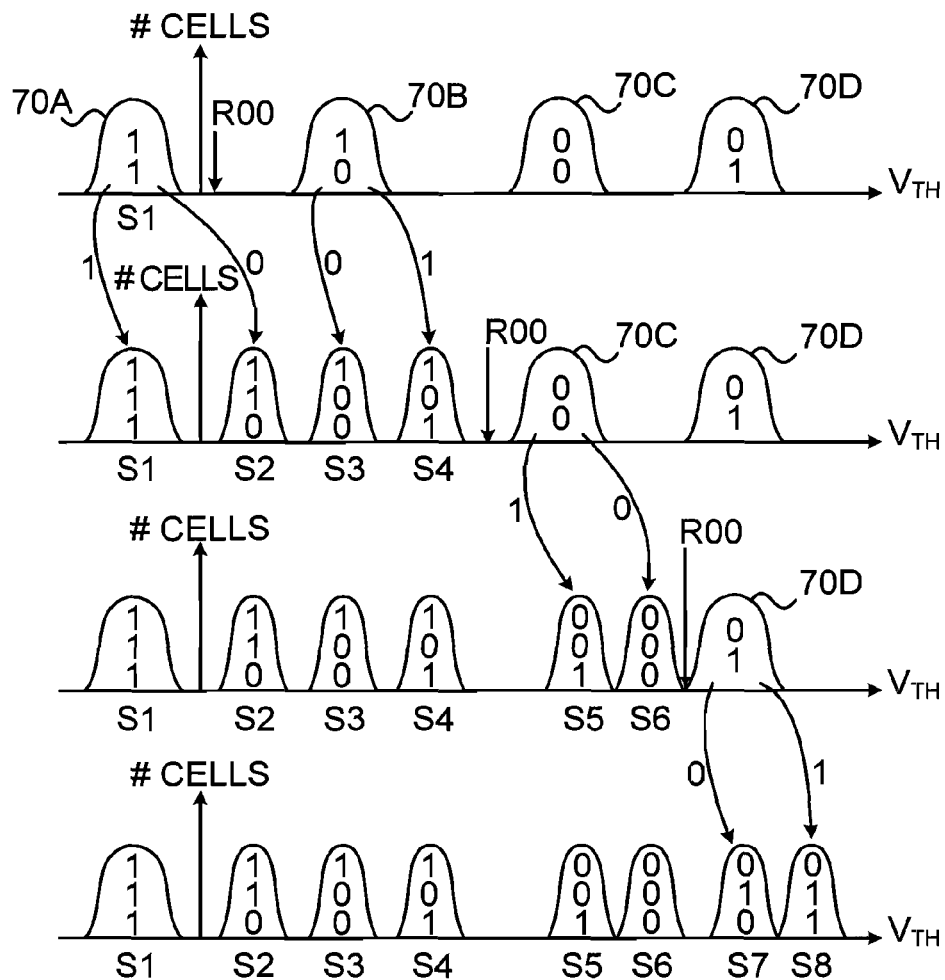
FIG. 3 is a diagram showing a process of storing data at three bits/cell using two bits/cell programming commands, in accordance with an embodiment of the present invention.

FIG. 3 is a diagram showing a process of storing data at three bits/cell using two bits/cell programming commands, in accordance with an embodiment of the present invention. The top graph in FIG. 3 shows the threshold voltage distribution in a group of cells after the first two pages (PAGE0 and PAGE1) have been programmed. MSP 40 typically programs the first two pages using the PAGE_0 and PAGE_1 programming commands supported by device 24, e.g., as shown in FIG. 2 above. After PAGE0 and PAGE1 are programmed, the threshold voltages of the memory cells are distributed in four programming states, in accordance with distributions 70A . . . 70D.

MSP 40 programs the third page (PAGE2) by applying a sequence of three PAGE_1 programming commands. First, the MSP applies a PAGE_1 programming command, which programs $BIT_2$ into the memory cells belonging to distributions 70A and 70B (i.e., to the memory cells that currently hold "11" and "10" data). The memory cells belonging to distributions 70C and 70D (i.e., to the memory cells that currently hold "00" and "01" data) are not affected at this stage. The result of the PAGE_1 programming command is shown in the second graph of FIG. 3. As can be seen in the figure, the first PAGE_1 programming command produces four distributions denoted S1 . . . S4, which represent the data bit combinations "111", "110", "100" and "101", respectively. Distributions 70C and 70D are unchanged.

In order to execute the PAGE_1 programming command appropriately, the MSP sets the PV levels of the command according to the desired locations of distributions (programming states) S1 . . . S4. The appropriate locations are below distributions 70C and 70D. In addition, the MSP sets read threshold R00 of the PAGE_1 programming command at or near 0V. Furthermore, when constructing the PAGE_1 command, the MSP sets the bit values programmed into the cells of distributions 70C and 70D, so as to prevent these cells from being affected by the P&V process. For example, the MSP may set the bit values programmed into these cells to "0". This setting corresponds to threshold voltages that are lower than the current cells' threshold voltages, and therefore the P&V process will not affect the memory cells in distributions 70C and 70D.

MSP 40 now applies another PAGE_1 programming command, which programs $BIT_2$ into the memory cells belonging to distribution 70C. This command produces two distributions (programming states) denoted S5 and S6, representing the bit value combinations "001" and "000", respectively. The result of the second PAGE_1 command is shown in the third graph of FIG. 3. In this command, read threshold R00 is set between distribution S4 and distribution 70C, and the PV levels are set to the desired positions of programming states S5 and S6. The bit values programmed into the memory cells in distributions S1 . . . S4 are set to "1", in order to prevent the P&V process from affecting them.

Finally, MSP 40 applies a third PAGE_1 programming command, which programs $BIT_2$ into the memory cells belonging to distribution 70D. This command produces two distributions (programming states) denoted S7 and S8, representing the bit value combinations "010" and "011", respectively. The result of this PAGE_1 command is shown in the bottom graph of FIG. 3. In the third PAGE_1 command, read threshold R00 is set between distribution S6 and distribution 70D, and the PV levels are set to the desired positions of programming states S7 and S8. The bit values programmed into the memory cells in distributions S1 . . . S4 are set to "1", in order to keep their threshold voltages unchanged.

The end result of the programming sequence is shown in the bottom graph of FIG. 3. As can be seen in the figure, MSP 40 has programmed a group of memory cells in a 2 bits/cell device at a density of 3 bits/cell (eight programming states), by applying a sequence of PAGE_0 and PAGE_1 built-in programming commands that are supported by the device. As can be appreciated, the programming time of PAGE2 is approximately three times the programming time of PAGE1. In many applications, however, the longer programming time is tolerable.

Figure 4:
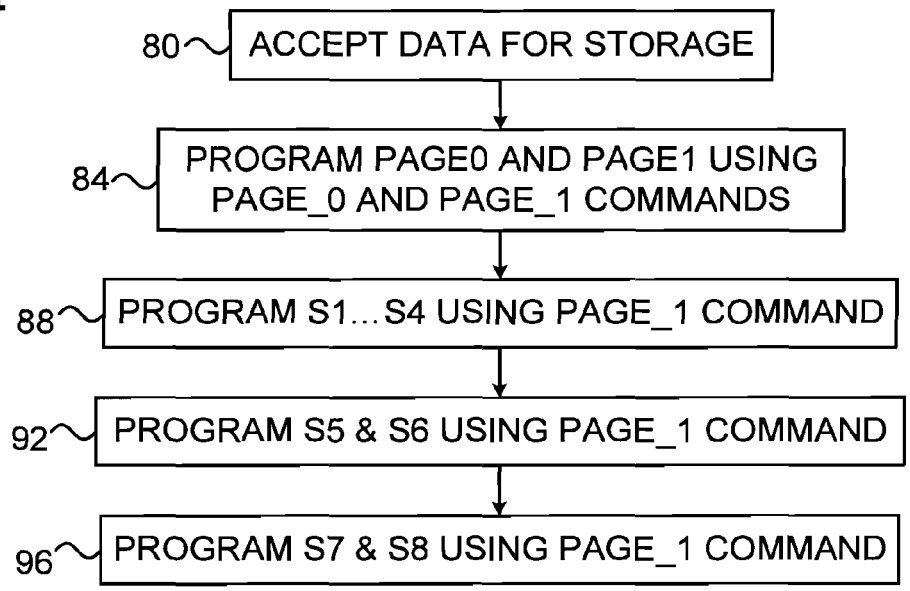
FIG. 4 is a flow chart that schematically illustrates a method for storing data at three bits/cell using two bits/cell programming commands, in accordance with an embodiment of the present invention.

FIG. 4 is a flow chart that schematically illustrates the above-described method for storing data at three bits/cell using two bits/cell programming commands, in accordance with an embodiment of the present invention. The method begins with MSP 40 accepts data for storage, at an input step 80. The MSP first programs PAGE0 and PAGE1 by applying PAGE_0 and PAGE_1 programming commands, at a first programming step 84. Then, the MSP produces programming states S1 . . . S4 by applying a PAGE_1 programming command, at a second programming step 88. The MSP then produces programming states S5 . . . S6 by applying another PAGE_1 programming command, at a third programming step 92. Finally, the MSP produces programming states 57 . . . 58 by applying yet another PAGE_1 programming command, at a fourth programming step 96. The MSP sets the command attributes (R00 and PV levels) for the different commands, as described with respect to FIG. 3 above.

M Bits/Cell Readout Using N Bits/Cell Read Commands, M>N

In some embodiments, MSP 40 reads data, which was stored in an N bits/cell memory device at a higher density of M bits/cell, M>N. In particular, the N bits/cell memory device typically supports a set of built-in read commands. Each read command reads the $i^{th}$ bit from a group of memory cells, for some $i \leq N$. In some embodiments, the MSP reads M bits from each memory cell in the group by applying a series of read commands, which are drawn only from the set of built-in read commands supported by the memory device. As will be shown below, the MSP typically notifies the memory device of the read thresholds to be used in the different read commands in the series.

Some aspects of readout using built-in read commands are also described in U.S. Patent Application Publication 2009/0106485, entitled "Reading Analog Memory Cells using Built-In Multi-Threshold Commands," which is assigned to the assignee of the present patent application and whose disclosure is incorporated herein by reference.

Figure 5:
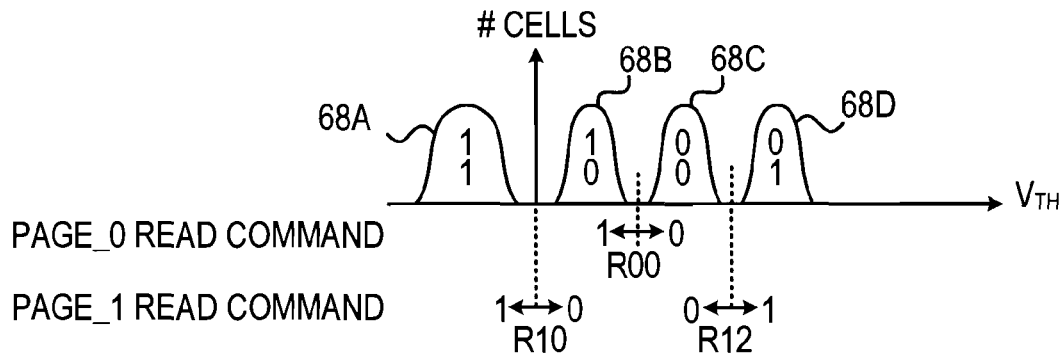
FIG. 5 is a diagram showing programming levels and a set of built-in read commands, in accordance with an embodiment of the present invention.

FIG. 5 is a diagram showing programming levels and a set of built-in read commands in a 2 bits/cell memory device, in accordance with an embodiment of the present invention. In the present example, the memory cells are programmed to four threshold voltage distributions 68A . . . 68D, which correspond to four respective programming states representing the bit value combinations "11", "10", "00" and "01".

R/W unit 36 of this memory device supports two built-in read commands: A PAGE_0 read command reads $BIT_0$ from a group of memory cells, and a PAGE_1 read commands reads $BIT_1$ from the memory cells in the group. The PAGE_0 read command compares the threshold voltages of the memory cells to a read threshold denoted R00. Threshold voltages smaller than R00 are interpreted as $BIT_0$="1", and threshold voltages larger than R00 are interpreted as $BIT_0$="0". The PAGE_1 read command compares the threshold voltages of the memory cells to two read thresholds denoted R10 and R12. Threshold voltages that fall between R10 and R12 are interpreted as $BIT_1$="0". Threshold voltages that are smaller than R10 or larger than R12 are interpreted as $BIT_1$="1". In some embodiments, the values of read thresholds R00, R10 and R12 can be set and modified by the MSP or other memory controller.

The description that follows demonstrates a process of reading data, which was stored in this memory device at a density of 3 bits/cell, using only the built-in PAGE_0 and PAGE_1 read commands supported by the memory device. In alternative embodiments, the process can be generalized in a straightforward manner to any desired values of N and M. As noted above, M and N need not necessarily be integers.

Figure 6:
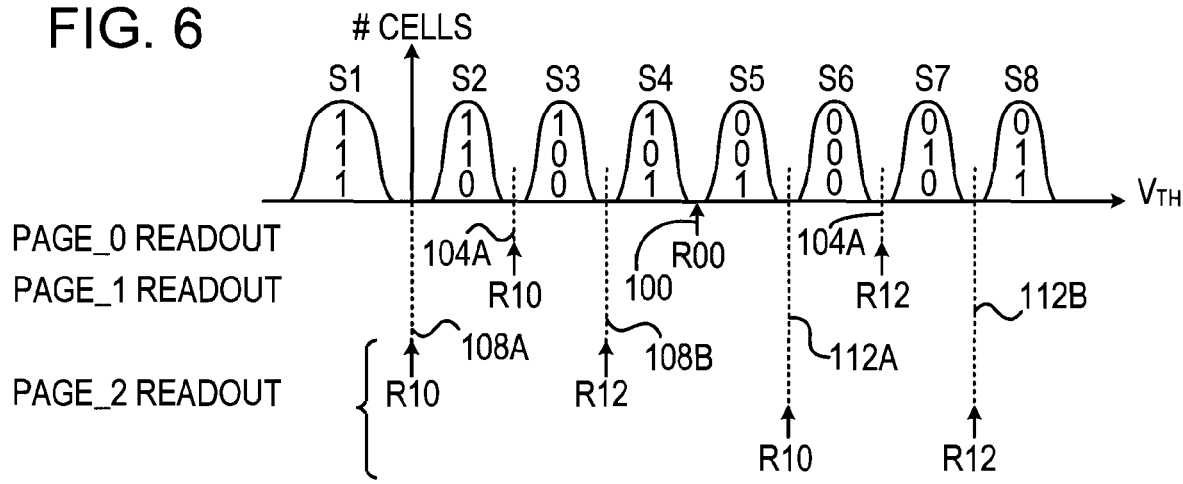
FIG. 6 is a diagram showing a process of reading data stored at three bits/cell using two bits/cell read commands, in accordance with an embodiment of the present invention.

FIG. 6 is a diagram showing a process of reading data stored at three bits/cell using two bits/cell read commands, in accordance with an embodiment of the present invention. In the present example, the memory cells are programmed to eight programming states denoted S1 . . . S8. A configuration of this sort can be produced, for example, by the process of FIGS. 3 and 4 above.

MSP 40 reads the data from the memory cells by applying a series of one PAGE_0 read command, followed by three PAGE_1 read commands. First, the MSP reads PAGE0 by applying a PAGE_0 read command, in which a read threshold (R00) 100 is positioned between S4 and S5. Threshold voltages smaller than threshold 100 are interpreted as $BIT_0$="1", and threshold voltages larger than threshold 100 are interpreted as $BIT_0$="0".

The MSP reads PAGE1 by applying a PAGE_1 read command, in which one read threshold (R10) 104A is positioned between S2 and S3, and a second read threshold (R12) 104B is positioned between S6 and S7. Threshold voltages that fall between the two thresholds are interpreted as $BIT_1$="0". Threshold voltages that are smaller than threshold 104A or larger than threshold 104B are interpreted as $BIT_1$="1".

The MSP reads PAGE2 by applying two additional PAGE_1 read commands. In one PAGE_1 read command, one read threshold (R10) 108A is positioned between S1 and S2, and another read threshold (R12) 108B is positioned between S3 and S4. In the other PAGE_1 read command, one read threshold (R10) 112A is positioned between S5 and S6, and another read threshold (R12) 112B is positioned between S7 and S8. Threshold voltages that fall between thresholds 108A and 108B, or between thresholds 112A and 112B, are interpreted as $BIT_2$="0". The other threshold voltages (i.e., threshold voltages smaller than threshold 108A, between thresholds 108B and 112A, or larger than threshold 112B) are interpreted as $BIT_2$="1".

Figure 7:
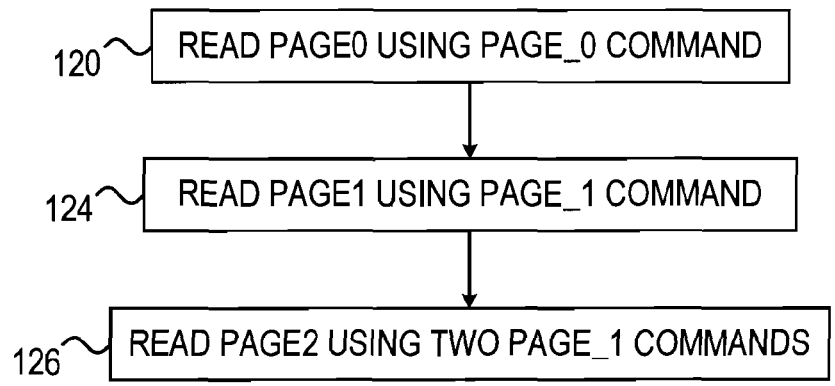
FIG. 7 is a flow chart that schematically illustrates a method for reading data stored at three bits/cell using two bits/cell programming commands, in accordance with an embodiment of the present invention.

FIG. 7 is a flow chart that schematically illustrates the above-described method for reading data stored at three bits/cell using two bits/cell programming commands, in accordance with an embodiment of the present invention. The method begins with MSP 40 reading PAGE0 using a built-in PAGE_0 read command, at a first readout step 120. The MSP reads PAGE1 using a built-in PAGE_1 read command, at a second readout step 124. The MSP reads PAGE2 using two built-in PAGE_1 read commands, as described above, at a third readout step 126. The MSP sets the read thresholds in each read command as described with respect to FIG. 6 above.

In some applications, data readout may be carried out using the above-described techniques, irrespective of how the data was programmed into the memory device in the first place. For example, in some applications (e.g., One-Time Programming (OTP) applications), the memory device is programmed by one entity and read by another entity. In these applications, programming of M bits/cell can be carried out using any suitable means, either using the disclosed techniques or otherwise. Data readout can be carried out by performing a series of N bits/cell read commands using the above-described techniques (e.g., the scheme of FIG. 7).

Alternative Programming Schemes

FIGS. 3 and 4 above demonstrated an example process of programming a 2 bits/cell memory device at a density of 3 bits/cell by applying a sequence of built-in programming commands that are supported by the device. The description below demonstrates several alternative processes, which use alternative sequences of built-in commands. Further alternatively, MSP 40 may use any other suitable command sequence.

Figure 8:
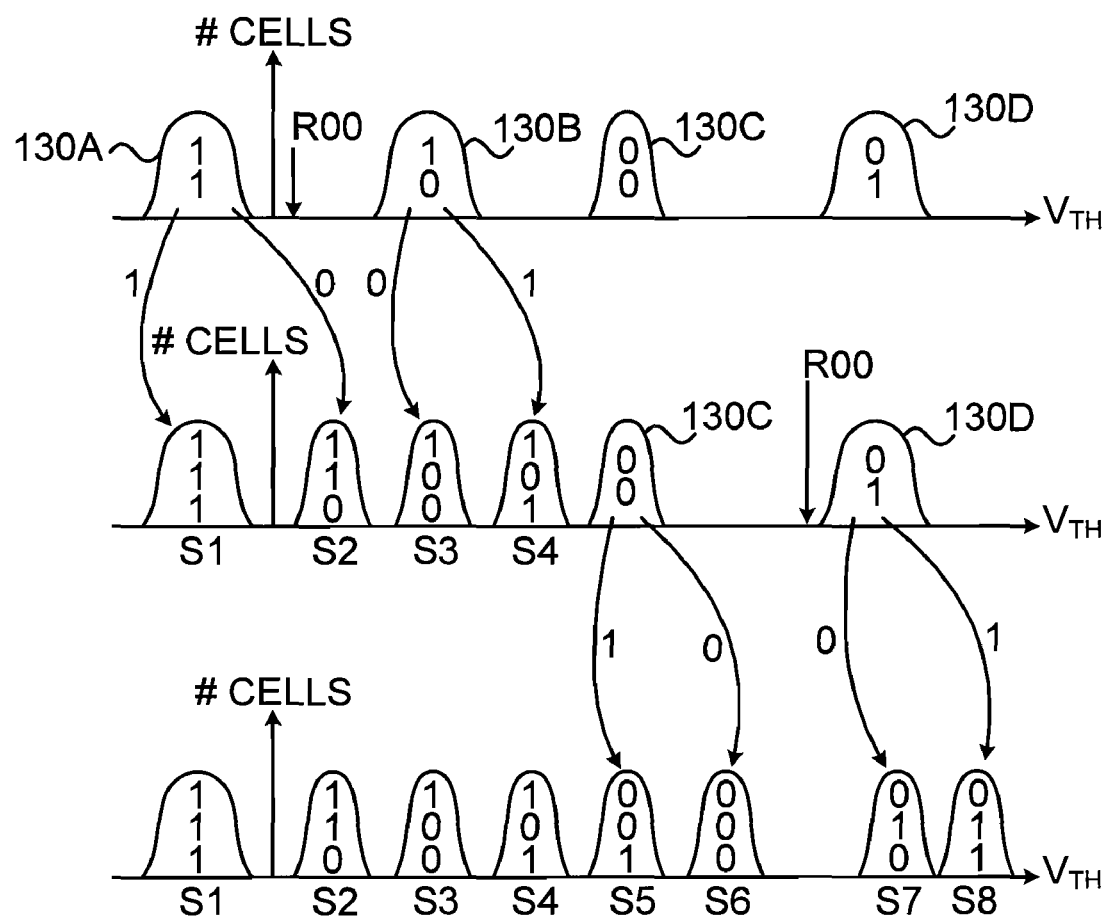
FIGS. 8-10 are diagrams showing processes of data storage at three bits/cell using two bits/cell programming commands, in accordance with alternative embodiments of the present invention.

FIG. 8 is a diagram showing a process of data storage at three bits/cell using two bits/cell programming commands, in accordance with another embodiment of the present invention. In the present example, the MSP programs PAGE2 using two PAGE_1 programming commands (instead of three commands in the example of FIGS. 3 and 4 above).

Initially, the MSP programs PAGE0 and PAGE1 using PAGE_0 and PAGE_1 programming commands, to produce four threshold voltage distributions 130A . . . 130D. In the present embodiment, however, distribution 130C is programmed with high accuracy. This accuracy is similar to that of the 3 bits/cell distributions S1 . . . S8. This feature is in contrast to the method of FIG. 3 above, in which PAGE0 and PAGE1 are typically programmed at lower accuracy in order to reduce programming time. Programming with high accuracy can be carried out, for example, by instructing the R/W unit to apply shorter or lower-amplitude programming pulses, or to use a smaller amplitude increment between successive programming pulses. The MSP may instruct the R/W unit to modify the programming accuracy, such as by modifying the command attributes. The threshold voltage distribution at this stage is shown in the top graph of FIG. 8.

The MSP applies a PAGE_1 programming command that programs $BIT_2$ in the memory cells belonging to distributions 130A and 130B. The first PAGE_1 command produces distributions S1 ... S4, as shown in the middle graph of FIG. 8. This stage is similar to the beginning of the process of FIG. 3 above. Then, the MSP applies a single PAGE_1 programming command that programs $BIT_2$ in the memory cells belonging to distributions 130C and 130D. Read threshold R00 is positioned immediately below distribution 130D for this command. The second command produces distributions S5 ... S8, as shown in the bottom graph of FIG. 8. Between the first and second PAGE_1 programming commands, the MSP sets the bit values programmed into the cells of distributions S1 ... S4 to "111", so as to prevent these cells from being affected by the P&V process.

The scheme of FIG. 8 provides faster programming time in comparison with the scheme of FIG. 3, because of the smaller number of programming commands in the sequence. At least part of this time saving, however, is compensated for by the additional time needed for programming distribution 130C with high accuracy. In an alternative embodiment, the MSP can program distribution 130C in two stages: (1) fast and rough programming of distributions 130A ... 130D using a PAGE_1 command, and (2) high-accuracy trimming of distribution 130C using a PAGE_0 command. Since PAGE_0 programming commands are typically much faster than PAGE_1 programming commands, this technique reduces the overall programming time of PAGE1, while programming distribution 130C with high accuracy.

Figure 9:
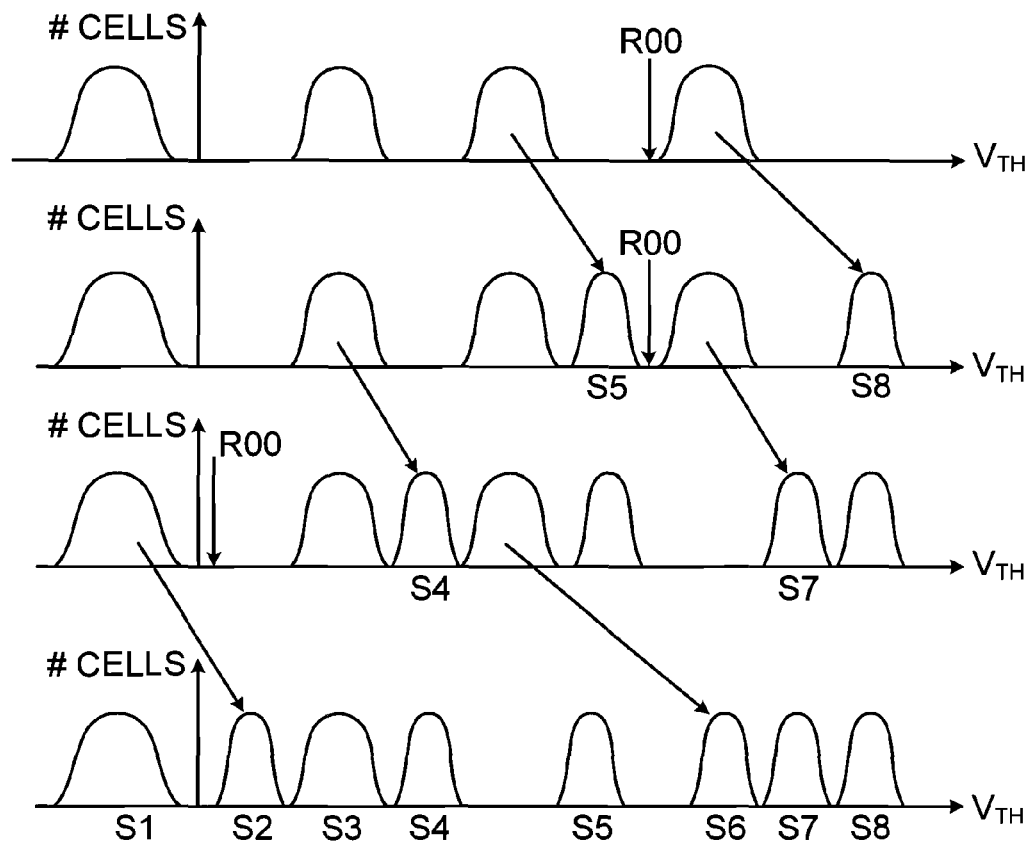

FIG. 9 is a diagram showing a process of data storage at three bits/cell using two bits/cell programming commands, in accordance with another alternative embodiment of the present invention. In this scheme, the MSP programs PAGE2 using a sequence of three PAGE_1 programming commands. The first command produces distributions S5 and S8 from the third and fourth distributions of PAGE1. R00 is positioned immediately below the fourth PAGE1 distribution in this command. The second command produces S4 and S7, with R00 positioned immediately above distribution S5. The third command produces S2 and S6, with R00 positioned at or near 0V. Distributions S1 and S3 correspond to the memory cells remaining in the original first and second PAGE1 distributions, respectively.

Figure 10:
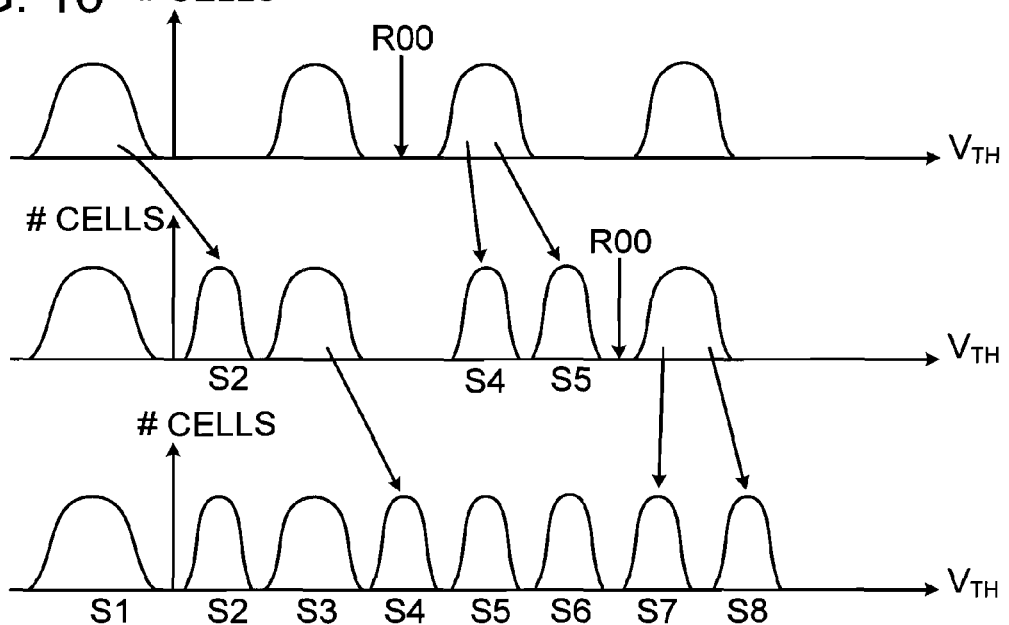

FIG. 10 is a diagram showing a process of data storage at three bits/cell using two bits/cell programming commands, in accordance with yet another embodiment of the present invention. In this scheme, MSP 40 programs PAGE2 using two PAGE_1 programming commands. The first command produces distributions S2, S4 and S5, with R00 positioned between the second and third PAGE1 distributions. The second command produces distributions S4, S7 and S8, with R00 positioned between distribution S5 and the fourth PAGE1 distribution. As noted above, at any given programming phase in FIG. 9 or 10, the MSP may set the bit values of certain distributions so as to prevent the P&V process form affecting these distributions.

In all of the programming schemes described herein, the order of the different programming steps in the sequence can be modified. In particular, the programming order can be selected so that higher programming states (i.e., programming states that correspond to high threshold voltages) are populated first. Programming higher programming states before lower programming states is sometimes advantageous for reducing impairments, such as disturb noise.

As noted above, some of the programming schemes described herein prevent the P&V process from affecting certain memory cells by selecting the bit values programmed into these cells. Some P&V processes, however, apply the first programming pulse before any verification takes place, i.e., regardless of whether the cells are already programmed to their intended threshold voltage levels or not. Such P&V processes will apply the first programming pulse to all the memory cells in the group, regardless of the programmed bit values. In most P&V processes, however, the first programming pulse is applied while biasing the memory cells' gates with a relatively low voltage. As a result, the first programming pulse will typically inject a relatively large amounts of charge into cells having small threshold voltages, and relatively small amounts of charge into cells having large threshold voltages. Thus, the effect of the first programming pulse can usually be tolerated, even for cells that have already reached their intended levels.

In general, programming an M bits/cell memory device at an N bits/cell density can be generalized as follows:
Store N bits/cell, using the built-in programming commands supported by the memory device.
Store the $(N+1)^{th}$ bit by performing the following:
Modify the $2^N-1$ programming thresholds, to program new $K_1$ programming levels.
Modify the $2^N-1$ programming thresholds, to program new $K_2$ programming levels.
Repeat J times, where $K_1+K_2+ \ldots +K_J=2^{N+1}$
Store bits N+2, ..., M by repeating the steps above.

In some embodiments, the techniques described herein can be carried out by R/W unit 36, i.e., internally in memory device 24. In these embodiments, the MSP controls the memory device using M bits/cell commands. The R/W unit translates each M bits/cell command to a sequence of N bits/cell commands, using any of the above-described methods, and accesses the memory array using the sequence of N bits/cell commands. This sort of configuration enables, for example, designing an M bits/cell memory device on the basis of an existing N bits/cell design with little modification. In these embodiments, the R/W unit may comprise a controller that executes suitable microcode for performing these tasks.

In some embodiments, a given design of memory device may support two operational modes. One mode (referred to as a "high-reliability mode") stores data at N bits/cell, whereas the other mode (referred to as a "high-capacity mode") stores data at M bits/cell, M>N. In some embodiments, the selection whether to operate the memory device in the high-reliability or in the high-capacity mode is made during production. Thus, a given memory device (or batch of devices) can be preconfigured during production to function as N bits/cell or as M bits/cell devices. In the first mode, a maximum of N pages can be stored in a given group of memory cells. In the second mode, a maximum of M pages can be stored in a given cell group. Such dual-mode operation enables memory manufacturers to enjoy the economy-of-scale benefits of producing large volumes of a given design, while at the same time offering multiple products having different storage capacities and reliability levels.

Alternatively, mode configuration of the memory device can be carried out by the user, not during production. Consider, for example, a 4 GB 2 bits/cell memory device. Such a device can be partitioned by the user into two partitions—one providing 2 GB using 2 bits/cell storage, and the other providing 3 GB using 3 bits/cell storage. The total capacity of the device in this mode is thus 5 GB.

In addition to increasing the achievable capacity of memory devices, the disclosed methods and systems can also reduce hardware size and complexity in the memory device. For example, an N bits/cell memory device typically comprises N page buffers, in which the memory device caches N pages that are mapped to a certain group of memory cells. By using the methods and systems described herein, a memory device can store M bits/cell, M>N, using no more than N page buffers. The reduction in the number of page buffers translates to lower device cost, size and complexity.

Example Timing Schemes

When carrying out the methods and systems described herein, MSP 40 and memory device 24 (or multiple memory devices 24) may interact according to various timing schemes. In the example given below, memory device 24 comprises two memory planes, and MSP 40 stores and retrieves data in the two planes at a density of 3 bits/cell.

Figure 11:
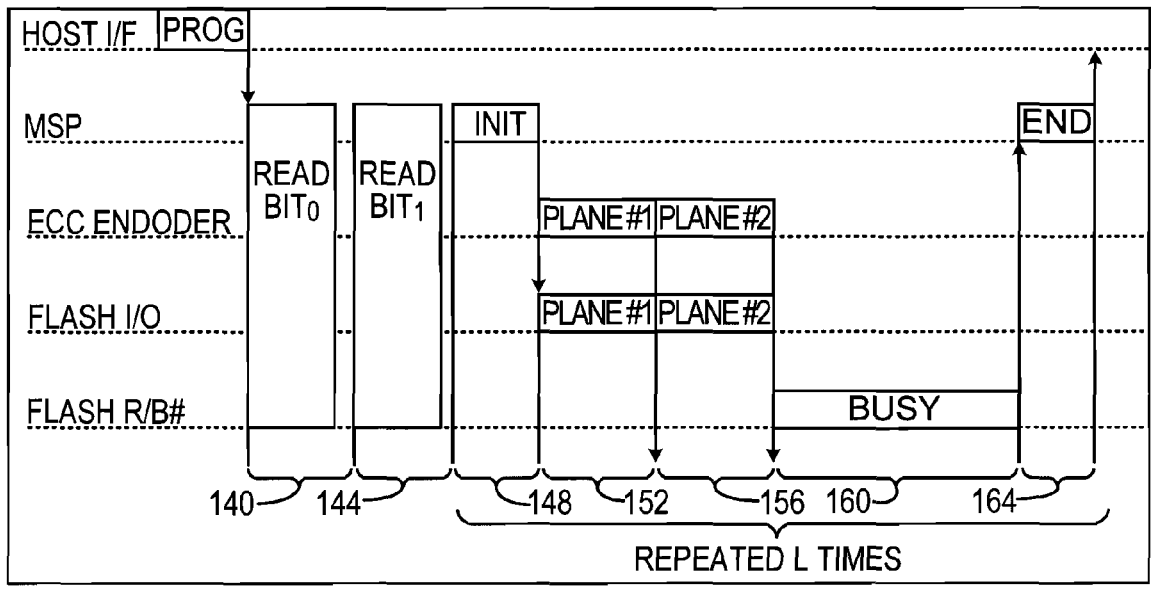
FIG. 11 is a timing diagram of a process for storing data at three bits/cell using two bits/cell programming commands, in accordance with an embodiment of the present invention.

FIG. 11 is a timing diagram of a process for storing data at three bits/cell using two bits/cell programming commands, in accordance with an embodiment of the present invention. The figure shows the process of programming $BIT_2$, or PAGE2. $BIT_0$ and $BIT_1$ are assumed to be programmed using any suitable scheme. The process begins with MSP 40 receiving from host 52 a request to program PAGE2 in a certain group of memory cells. As noted above, the programming state for a given memory cell depends on the $BIT_2$ value to be programmed, as well as on the previously-programmed $BIT_0$ and $BIT_1$ values.

Thus, in order to compute the appropriate programming states for programming PAGE2, the MSP reads PAGE0 and PAGE1 ($BIT_0$ and $BIT_1$) from the memory cells. $BIT_0$ is read during an interval 140, and $BIT_1$ is read during an interval 144. In some embodiments, the data stored in PAGE0 and/or PAGE1 is encoded with an Error Correction Code (ECC) prior to storage. In some embodiments, MSP 40 decodes the ECC of PAGE0 and/or PAGE1 in order to reduce the probability of read errors. Alternatively, the MSP may refrain from decoding the ECC to reduce latency. Further alternatively, the MSP may cache the data of PAGE0 and PAGE1 instead of reading it from the memory device.

During an interval 148, the MSP initializes its internal circuitry, as well as R/W unit 36 of the memory device. The MSP sends the PAGE2 data for programming, at intervals 152 and 156. In the present example, the memory device comprises two memory planes and storage is carried out using multi-plane programming commands. Thus, interval 148 is used for programming one plane, and interval 152 is used for programming the other plane. During an interval 160, the memory device is busy writing the data into its memory cells. The MSP waits until the storage operation is completed. At an interval 164, the MSP prepares for the next iteration, e.g., modifies the programming verification and read thresholds, and sets bit values in certain distributions so that they will not be affected by the P&V process. Steps 148-164 are typically repeated several times (denoted L times), depending on the specific programming scheme used and on the values of M and N.

In some embodiments, the memory device and MSP may reduce the PAGE2 programming time by caching and semi-parallelizing the L programming iterations. For example, the MSP may program the first and second planes of a given iteration (as in intervals 152 and 156), which in parallel the memory device is busy programming the previous iteration (as in step 160). Thus, for example, if L=3, then programming the two planes of the second and third iterations can overlap the busy period of the first and second iterations.

Figure 12:
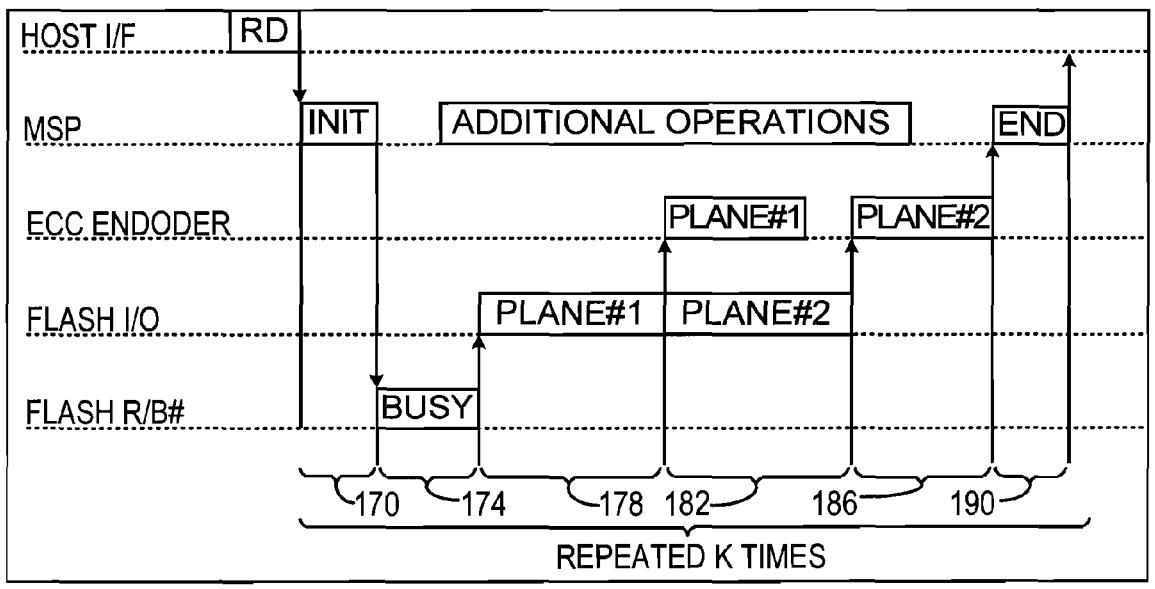
FIG. 12 is a timing diagram of a process for reading data stored at three bits/cell using two bits/cell read commands, in accordance with an embodiment of the present invention.

FIG. 12 is a timing diagram of a process for reading data stored at three bits/cell using two bits/cell read commands, in accordance with an embodiment of the present invention. The figure shows the process of reading $BIT_2$, or $PAGE_2$, using a series of K PAGE_1 read commands. The process begins with MSP 40 receiving from host 52 a request to read PAGE2 from a given group of memory cells. At a time interval 170, the MSP initializes its internal circuitry, as well as R/W unit 36 of the memory device. At an interval 174, the memory device is busy reading the data from the memory cells in response to the current PAGE_1 read command. In the present example, the memory device comprises two memory planes and data readout is carried out using multi-plane read commands. At an interval 178, the memory device outputs the data read from one plane. At an interval 182, the memory device outputs the data read from the second plane. In parallel, during interval 182 the MSP may decode the ECC of the data read from the first plane. At an interval 186, the MSP decodes the ECC of the data read from the second plane. At an interval 190, the MSP prepares for the next iteration, e.g., modifies the read thresholds and sets bit values in certain distributions so that they will not be affected by the P&V process, as explained above. Steps 170-190 are repeated K times, wherein K depends on the specific programming scheme used.

Although the embodiments described herein refer mainly to configurations in which the different bits that are mapped to a given memory cell belong to different logical pages, the methods and systems described herein are not limited to such configurations. In other words, the methods and systems described herein can be used to store M bits/cell in a group of N bits/cell memory cells, M>N, wherein the data stored in these cells is logically defined as less than M pages. The additional storage capacity gained by the disclosed techniques need not necessarily be used for storing user data (data provided by host 52). For example, some or all of the additional storage capacity can be designated for redundancy bits, thus enabling the use of a stronger ECC.

Although the embodiments described herein mainly address high-density storage in solid state memory devices, the methods and systems described herein can also be used in any other suitable application. The disclosed techniques can also be used to store M<N bits/cell in an N bits/cell device, wherein M is not an integer power of 2. For example, the MSP can program a 2 bits/cell (four-level) device with only three programming levels, so as to improve immunity to noise and distortion.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
   accepting data for storage in a memory that includes multiple analog memory cells and supports a set of built-in programming commands, each of which programming commands programs a respective page, selected from a group consisting of a first positive integer number, N, of pages, in a subset of the memory cells; and
   programming the subset of the memory cells to store a second positive integer number, M, of the pages of the data, M>N, by performing a sequence of the programming commands drawn only from the set.

2. The method according to claim 1, wherein the memory further supports a list of built-in read commands, each of which read commands reads a respective one of the group of the N pages, and comprising reading the M pages from the subset of the memory cells by performing a series of read commands drawn only from the list.

3. The method according to claim 2, wherein performing the series of the read commands comprises notifying the memory of one or more read threshold values to be applied in at least one of the read commands in the series.

4. The method according to claim 1, wherein programming the subset of the memory cells comprises caching the data in the memory in no more than N page buffers.

5. The method according to claim 1, wherein programming the subset of the memory cells comprises notifying the memory of one or more programming threshold values to be applied in at least one of the programming commands in the sequence.

6. The method according to claim 1, wherein programming the subset of the memory cells comprises applying a series of programming pulses to the memory cells in the subset, and notifying the memory of a characteristic of the programming pulses to be applied during at least one of the programming commands in the sequence.

7. The method according to claim 1, wherein a given programming command in the sequence involves reading a previously-programmed page from the subset of the memory cells using one or more read thresholds, and wherein programming the subset of the memory cells comprises notifying the memory of respective values of the one or more read thresholds.

8. The method according to claim 1, wherein programming the subset of the memory cells comprises, during a given programming command in the sequence, modifying respective storage values of only some of the memory cells in the subset by programming the other memory cells in the subset with respective data values that cause their storage values to remain unchanged by the given programming command.

9. The method according to claim 1, and comprising configuring the memory to operate in one of first and second operational modes, wherein programming the subset of the memory cells comprises storing a maximum of M pages in the subset of the memory cells when operating in the first operational mode, and storing a maximum of N pages in the subset of the memory cells when operating in the second operational mode.

10. A data storage apparatus, comprising:
an interface for communicating with a memory that includes multiple analog memory cells and supports a set of built-in programming commands, each of which programming commands programs a respective page, selected from a group consisting of a first positive integer number, N, of pages, in a subset of the memory cells; and
a processor, which is configured to accept data for storage in the memory, and to program the subset of the memory cells to store a second positive integer number, M, of the pages of the data, M>N, by performing a sequence of the programming commands drawn only from the set.

11. The apparatus according to claim 10, wherein the memory further supports a list of built-in read commands, each of which read commands reads a respective one of the group of the N pages, and wherein the processor is configured to read the M pages from the subset of the memory cells by performing a series of read commands drawn only from the list.

12. The apparatus according to claim 11, wherein the processor is configured to notify the memory of one or more read threshold values to be applied in at least one of the read commands in the series.

13. The apparatus according to claim 10, wherein the processor is configured to cache the data in the memory in no more than N page buffers when programming the subset of the memory cells.

14. The apparatus according to claim 10, wherein the processor is configured to notify the memory of one or more programming threshold values to be applied in at least one of the programming commands in the sequence.

15. The apparatus according to claim 10, wherein the memory device programs the subset of the memory cells by applying a series of programming pulses to the memory cells in the subset, and wherein the processor is configured to notify the memory of a characteristic of the programming pulses to be applied during at least one of the programming commands in the sequence.

16. The apparatus according to claim 10, wherein a given programming command in the sequence involves reading a previously-programmed page from the subset of the memory cells using one or more read thresholds, and wherein the processor is configured to notify the memory of respective values of the one or more read thresholds.

17. The apparatus according to claim 10, wherein the processor is configured to modify, during a given programming command in the sequence, respective storage values of only some of the memory cells in the subset by programming the other memory cells in the subset with respective data values that cause their storage values to remain unchanged by the given programming command.

18. The apparatus according to claim 10, wherein the memory is configurable to operate in one of first and second operational modes, wherein a maximum of M pages is stored in the subset when operating in the first operational mode, and a maximum of N pages is stored in the subset when operating in the second operational mode.

19. A data storage apparatus, comprising:
a memory, which comprises multiple analog memory cells and supports a set of built-in programming commands, each of which programming commands programs a respective page, selected from a group consisting of a first positive integer number, N, of pages, in a subset of the memory cells; and
a processor, which is configured to accept data for storage in the memory, and to program the subset of the memory cells to store a second positive integer number, M, of the pages of the data, M>N, by performing a sequence of the programming commands drawn only from the set.

20. The apparatus according to claim 19, wherein the memory further supports a list of built-in read commands, each of which read commands reads a respective one of the group of the N pages, and wherein the processor is configured to read the M pages from the subset of the memory cells by performing a series of read commands drawn only from the list.

21. The apparatus according to claim 19, wherein the memory comprises a third number of page buffers that is not greater than N, and is configured to cache the data in the page buffers when programming the subset of the memory cells.

22. A method for data storage, comprising:
accepting data for storage in a memory that includes multiple analog memory cells and supports a set of built-in programming commands for programming the memory cells to a first number of programming states; and
programming the memory cells to a second number of programming states, which is less than the first number and is not an integer power of two, by performing a sequence of the programming commands drawn only from the set.

23. A method for data storage, comprising:
accepting a request to retrieve data from a memory, which includes multiple analog memory cells, holds a first positive integer number, M, of pages of the data in a subset of the memory cells, and supports a list of built-in read commands, each of which read commands reads a respective one of a second positive integer number, N, of the pages, N<M; and
responsively to the request, reading the M pages from the subset of the memory cells by performing a series of read commands drawn only from the list.

24. The method according to claim 23, wherein performing the series of the read commands comprises notifying the memory of one or more read threshold values to be applied in at least one of the read commands in the series.

* * * * *